(12) United States Patent
Lee et al.

(10) Patent No.: US 11,239,177 B2
(45) Date of Patent: Feb. 1, 2022

(54) SEMICONDUCTOR PACKAGES INCLUDING DIE OVER-SHIFT INDICATING PATTERNS

(71) Applicant: SK hynix Inc., Icheon-si (KR)

(72) Inventors: Sukwon Lee, Icheon-si (KR); Bok Gyu Min, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/884,777

(22) Filed: May 27, 2020

(65) Prior Publication Data

US 2020/0286838 A1 Sep. 10, 2020

Related U.S. Application Data

(62) Division of application No. 15/981,603, filed on May 16, 2018, now Pat. No. 10,692,816.

(30) Foreign Application Priority Data

Nov. 9, 2017 (KR) .......................... 10-2017-0148848

(51) Int. Cl.
| | |
|---|---|
| *H01L 23/544* | (2006.01) |
| *H01L 23/13* | (2006.01) |
| *H01L 21/683* | (2006.01) |
| *H01L 23/31* | (2006.01) |
| *H01L 23/00* | (2006.01) |
| *H01L 25/065* | (2006.01) |

(52) U.S. Cl.
CPC .......... *H01L 23/544* (2013.01); *H01L 21/683* (2013.01); *H01L 23/13* (2013.01); *H01L 23/3128* (2013.01); *H01L 24/01* (2013.01); *H01L 25/0652* (2013.01); *H01L 25/0657* (2013.01); *H01L 2223/5442* (2013.01); *H01L 2223/54426* (2013.01); *H01L 2223/54486* (2013.01); *H01L 2224/26135* (2013.01)

(58) Field of Classification Search
CPC ................... H01L 23/13; H01L 23/544; H01L 2223/54486; H01L 2223/54426; H01L 25/0657; H01L 25/0652
See application file for complete search history.

(56) References Cited

U.S. PATENT DOCUMENTS

| | | | |
|---|---|---|---|
| 6,046,499 | A | 4/2000 | Vano et al. |
| 9,165,897 | B2 * | 10/2015 | Lee ..................... H01L 23/5386 |
| 9,455,211 | B2 | 9/2016 | Chiu et al. |
| 9,865,574 | B2 | 1/2018 | Huang et al. |
| 10,103,128 | B2 | 10/2018 | Chou et al. |
| 10,217,726 | B1 * | 2/2019 | Nakano ............... H01L 25/0657 |
| 10,312,196 | B2 | 6/2019 | Lee et al. |
| 10,490,529 | B2 * | 11/2019 | Chiu .................... H01L 23/3121 |
| 2002/0114507 | A1 | 8/2002 | Lynch et al. |
| 2005/0121802 | A1 * | 6/2005 | Kawano ............... H01L 25/0657 257/777 |

(Continued)

*Primary Examiner* — Mohsen Ahmadi

(74) *Attorney, Agent, or Firm* — William Park & Associates Ltd.

(57) ABSTRACT

A semiconductor package includes a package substrate including a die attachment region, a semiconductor die attached to the die attachment region, and a die over-shift indicating pattern disposed on or in the package substrate and spaced apart from the die attachment region. The die over-shift indicating pattern is used as a reference pattern for obtaining a shifted distance of the semiconductor die.

6 Claims, 9 Drawing Sheets

(56) References Cited

U.S. PATENT DOCUMENTS

| | | |
|---|---|---|
| 2007/0132084 A1* | 6/2007 | Sung .................... H01L 21/565 257/686 |
| 2010/0072602 A1 | 3/2010 | Sutardja |
| 2011/0084382 A1 | 4/2011 | Chen et al. |
| 2012/0056327 A1* | 3/2012 | Harada ................ H01L 23/544 257/773 |
| 2013/0078763 A1 | 3/2013 | Lee et al. |
| 2013/0249079 A1 | 9/2013 | Lee et al. |
| 2014/0374922 A1 | 12/2014 | Huang et al. |
| 2015/0108615 A1* | 4/2015 | Dayringer ............... H01L 24/81 257/623 |
| 2015/0279787 A1* | 10/2015 | Kim ..................... H01L 23/544 257/777 |
| 2017/0103973 A1* | 4/2017 | Yu ...................... H01L 23/5389 |
| 2017/0170127 A1 | 6/2017 | Choi et al. |
| 2018/0158809 A1* | 6/2018 | Kim ....................... H01L 25/18 |
| 2018/0277518 A1* | 9/2018 | Iida .................... H01L 21/0214 |
| 2019/0019761 A1 | 1/2019 | Lee et al. |
| 2019/0333782 A1 | 10/2019 | Wang et al. |

\* cited by examiner

SEMICONDUCTOR PACKAGES INCLUDING DIE OVER-SHIFT INDICATING PATTERNS

CROSS-REFERENCE TO RELATED APPLICATIONS

The present application is a divisional application of U.S. patent application Ser. No. 15/981,603, filed on May 16, 2018, which claims priority under 35 U.S.C 119(a) to Korean Application No. 10-2017-0148848, filed on Nov. 9, 2017, which is incorporated herein by reference in its entirety.

BACKGROUND

1. Technical Field

The present disclosure relates to semiconductor package technologies and, more particularly, to semiconductor packages including die over-shift indicating patterns.

2. Related Art

Various semiconductor packages have been employed in electronic products. For example, various types of semiconductor packages have been adopted in mobile systems such as smart phones or tablet computers. In particular, the mobile systems require compact semiconductor packages, for example, light and thin semiconductor packages having a large memory capacity and a small form factor.

SUMMARY

According to an embodiment, a semiconductor package includes a package substrate including a die attachment region, a semiconductor die attached to the die attachment region, and a die over-shift indicating pattern disposed on or in the package substrate and spaced apart from the die attachment region. The die over-shift indicating pattern is used as a reference pattern for obtaining a shifted distance of the semiconductor die.

According to another embodiment, a semiconductor package includes a package substrate including a die attachment region, a first semiconductor die attached to the die attachment region, a second semiconductor die stacked on the first semiconductor die and offset from the first semiconductor die, and a die over-shift indicating pattern disposed on or in the package substrate and spaced apart from the die attachment region. The die over-shift indicating pattern is used as a reference pattern for obtaining a shifted distance of the second semiconductor die.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
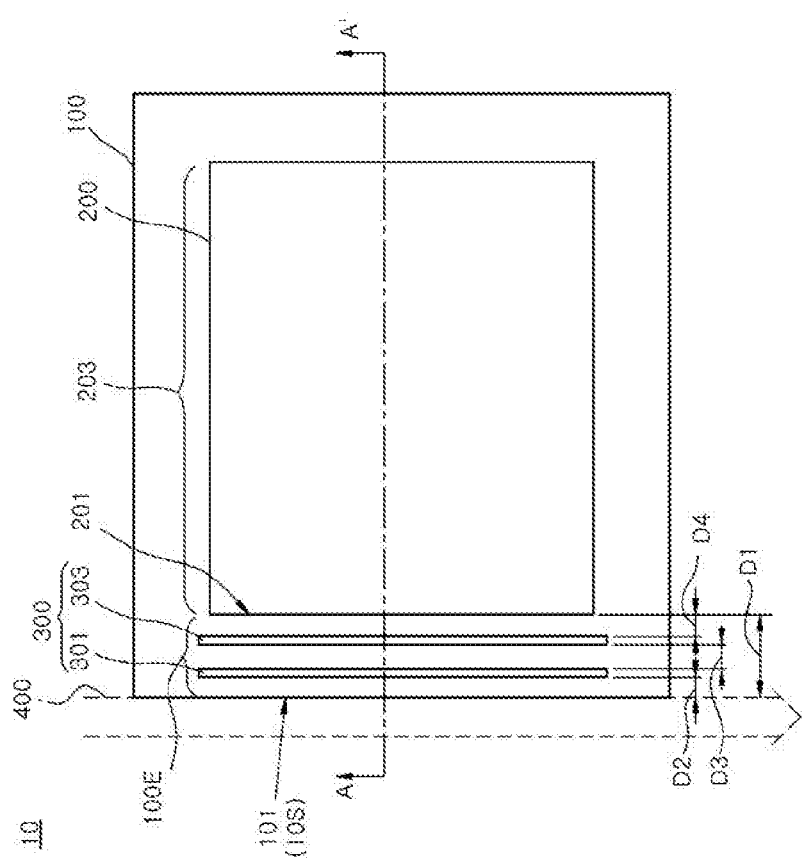
FIG. 1 is a plan view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

A semiconductor package may include electronic devices such as semiconductor chips or semiconductor dies. The semiconductor chips or the semiconductor dies may be obtained by separating a 1$ semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

As the semiconductor packages become scaled down, a distance between a side surface of the semiconductor package and a semiconductor die embedded in the semiconductor package has been reduced. In such a case, cracks may be formed in a package substrate of the semiconductor package, or the semiconductor die embedded in the semiconductor package can be seen through a sidewall of the semiconductor package. In order to prevent the above failures, it may be necessary that the semiconductor die is spaced apart from the sidewall of the semiconductor package by at least a certain distance.

In order to fabricate the semiconductor package so that the semiconductor die in the semiconductor package is spaced apart from the sidewall of the semiconductor package by at least the certain distance, it may be required to detect or verify a location of the semiconductor die disposed in the semiconductor package. Accordingly, the following embodiments of the present disclosure provide solutions for determining whether the semiconductor die is disposed in an allowable shifted area after the semiconductor die is attached to the package substrate.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
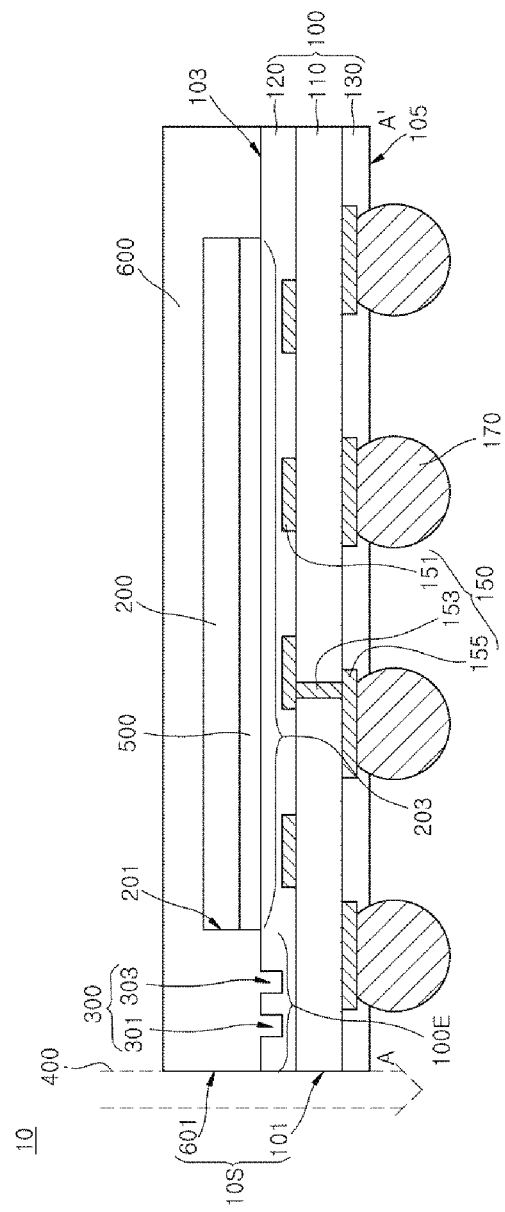
FIG. 2 is a cross-sectional view taken along a line A-A' of FIG. 1.

FIG. 1 is a plan view illustrating a semiconductor package 10 according to an embodiment. FIG. 2 is a cross-sectional view taken along a line A-A' of FIG. 1.

Referring to FIGS. 1 and 2, the semiconductor package 10 may include a package substrate 100, a semiconductor die 200 disposed on the package substrate 100, and an encapsulant 600 covering and protecting the semiconductor die 200. For the purpose of ease and convenience in explanation, the encapsulant 600 is omitted in FIG. 1. The semiconductor die 200 may be attached to the package substrate 100 using an adhesive layer 500. The semiconductor package 10 may further include a die over-shift indicating pattern 300. The die over-shift indicating pattern 300 may act as an indicator that provides information on whether the semiconductor die 200 is excessively shifted from a die attachment region 203. The package substrate 100 may include the die attachment region 203. If the semiconductor die 200 is attached to the package substrate 100 to extend beyond an allowable attachment tolerance region during an attachment process, the semiconductor die 200 may be regarded as being in a die over-shift state. The die over-shift indicating pattern 300 may be used as an indicating pattern for determining whether the semiconductor die 200 is in a die over-shift state.

The die over-shift indicating pattern 300 may be disposed in an edge region 100E of the package substrate 100, which is adjacent to a sawn side surface 101 of the package substrate 100. The die over-shift indicating pattern 300 may be disposed on a first surface 103 of the package substrate 100. The first surface 103 of the package substrate 100 may correspond to a surface to which the semiconductor die 200 is attached. The edge region 100E of the package substrate 100 may correspond to a region located between the die attachment region 203 and the sawn side surface 101 of the package substrate 100. Thus, the die over-shift indicating pattern 300 may be disposed between the side surface 101 of the package substrate 100 and the die attachment region 203.

When viewed from the plan view of FIG. 1, the die over-shift indicating pattern 300 may be formed on the first surface 103 of the package substrate 100. The die over-shift indicating pattern 300 may be formed to be recognized by human eyes without any tools or with optical microscopes. The die over-shift indicating pattern 300 may be formed to be visually recognized by human eyes without any tools or with optical microscopes of relatively low magnifying power. Accordingly, it may be possible to more readily determine whether the semiconductor die 200 is in a die over-shift state even without using high performance apparatuses, for example, electron microscopes of relatively high magnifying power or inspection tools using X-ray.

The die over-shift indicating pattern 300 may be formed on the first surface 103 of the package substrate 100 to be exposed at the first surface 103 or may be formed in the package substrate 100 to be seen through a portion of the package substrate 100. For example, the die over-shift indicating pattern 300 may be formed by engraving portions of the first surface 103 of the package substrate 100 to have a groove shape. More specifically, the die over-shift indicating pattern 300 may be formed by engraving portions of the first surface 103 of the package substrate 100 using a laser to have a groove shape. In an embodiment, the die over-shift indicating pattern 300 may be formed by etching or patterning a first dielectric layer 120 of the package substrate 100 using an etch process.

The first dielectric layer 120 may be one of many layers constituting the package substrate 100. For example, the first dielectric layer 120 may be a solder resist layer disposed on a surface of a body layer 110 included in the package substrate 100.

The package substrate 100 may have an interconnection structure that electrically connects the semiconductor die 200 to an external device or an external system. The interconnection structure may include conductive interconnection patterns 150. The package substrate 100 may include the body layer 110 comprised of a dielectric layer, the first dielectric layer 120 disposed on a surface of the body layer 110, and a second dielectric layer 130 disposed on another surface of the body layer 110 opposite the first dielectric layer 120. The conductive interconnection patterns 150 may include first interconnection patterns 151 which are disposed on a surface of the body layer 110 and covered by the first dielectric layer 120. The conductive interconnection patterns 150 may also include second interconnection patterns 155 which are disposed on another surface of the body layer 110 and covered by the second dielectric layer 130. A surface of the second dielectric layer 130 opposite the body layer 110 may provide a second surface 105 of the package substrate 100.

The conductive interconnection patterns 150 may further include internal interconnection patterns 153 that substantially penetrate the body layer 110 to electrically connect the first interconnection patterns 151 to the second interconnection patterns 155. The internal interconnection patterns 153 may include conductive vias substantially penetrating the body layer 110. The second dielectric layer 130 may be formed to leave a portion of each of the second interconnection patterns 155 exposed. Outer connectors 170, for example, solder balls may be attached to the exposed portions of the second interconnection patterns 155, respectively. The second dielectric layer 130 may include a solder resist material.

Referring again to FIG. 1, the die over-shift indicating pattern 300 may be formed to have a line shape extending in a direction which is substantially parallel with a sawing region 400 that physically separates a plurality of semiconductor packages 10 from each other. The sawing region 400 may correspond to a region along which a sawing process is performed.

The semiconductor package 10 may be fabricated by a mass production process. Specifically, a plurality of the semiconductor dies 200 may be attached to a strip substrate comprised of a plurality of the package substrates 100 which are connected to each other, and a protection layer (corresponding to the encapsulant 600 shown in FIG. 2) may be molded to cover the semiconductor dies 200 to form a molding product. Subsequently, the strip substrate and the protection layer may be cut along the sawing region 400 using a sawing blade to physically separate the package substrates 100 from each other. The sawing region 400 may be set when the strip substrate is designed. The die over-shift indicating pattern 300 may be formed to include line-shaped patterns extending in a direction which is substantially parallel with the sawing region 400.

If the sawing process for cutting the strip substrate along the sawing region 400 is performed normally, the sawn side surface 101 of the package substrate 100 may be substantially parallel with the sawing region 400. Thus, the die over-shift indicating pattern 300 may be formed to include line-shaped patterns extending in a direction which is substantially parallel with the sawn side surface 101 of the package substrate 100.

A side surface 10S of the semiconductor package 10 may include the sawn side surface 101 of the package substrate 100 and a sawn side surface 601 of the encapsulant 600, as illustrated in FIG. 2. The die over-shift indicating pattern 300 may include line-shaped patterns extending in a direction which is parallel with the sawn side surface 101 of the package substrate 100. Thus, the die over-shift indicating pattern 300 may be parallel with the sawn side surface 101 of the package substrate 100 and the sawn side surface 601 of the encapsulant 600 when viewed from a plan view.

If the semiconductor die 200 is normally attached to the die attachment region 203, the die over-shift indicating pattern 300 may be parallel with a side surface 201 of the semiconductor die 200 or a line at the side of the die attachment region 203. The die over-shift indicating pattern 300 may be disposed spaced apart from the die attachment region 203. The die over-shift indicating pattern 300 may be disposed between the sawing region 400 and the die attachment region 203. The die over-shift indicating pattern 300 may include a first die over-shift indicating pattern 301 and a second die over-shift indicating pattern 303. The second die over-shift indicating pattern 303 may be disposed between the first die over-shift indicating pattern 301 and the die attachment region 203.

Referring still to FIG. 1, if the semiconductor die 200 is normally attached to the die attachment region 203, the side surface 201 of the semiconductor die 200 may be spaced apart from the sawing region 400 by a first distance D1. If the sawing process is performed normally along the sawing region 400, the sawn side surface 101 of the package substrate 100 may be spaced apart from the line at the side of the die attachment region 203 by the first distance D1. The first die over-shift indicating pattern 301 may be disposed spaced apart from the sawing region 400 by a second distance D2. The first die over-shift indicating pattern 301 may extend to be parallel with the sawn side surface 101 of the package substrate 100. The second die over-shift indicating pattern 303 may be disposed spaced apart from the first die over-shift indicating pattern 301 by a third distance D3. The second die over-shift indicating pattern 303 may be disposed spaced apart from the line at the side of the die attachment region 203 by a fourth distance D4. The second die over-shift indicating pattern 303 may be spaced apart from the first die over-shift indicating pattern 301 and may be parallel with the first die over-shift indicating pattern 301.

The fourth distance D4 may be equal to the third distance D3. The third distance D3 and the fourth distance D4 may be equal to the second distance D2. Thus, a degree that the semiconductor die 200 is shifted may be easily obtained by inspecting the semiconductor die 200 together with the first die over-shift indicating pattern 301 or the second die over-shift indicating pattern 303. That is, it may be possible to discover the amount that the semiconductor die 200 is shifted over using an inspection tool of relatively low magnifying power by determining the first and second die over-shift indicating patterns 301 and 303.

Even though FIG. 1 illustrates an example in which the die over-shift indicating pattern 300 includes only two parallel line-shaped patterns that are the first and second die over-shift indicating patterns 301 and 303 which are parallel with each other and are spaced apart from each other, the present disclosure is not limited thereto. For example, in some other embodiments, the die over-shift indicating pattern 300 may include three or more line-shaped patterns which are parallel with each other.

Although FIG. 1 illustrates an example in which the die over-shift indicating pattern 300 is disposed at one edge region 100E of the package substrate 100, the present disclosure is not limited thereto. For example, in some other embodiments, the die over-shift indicating pattern 300 may be disposed at two or more edges of the package substrate 100. More specifically, the die over-shift indicating pattern 300 may be disposed at four edges of the package substrate 100.

Figure 3:
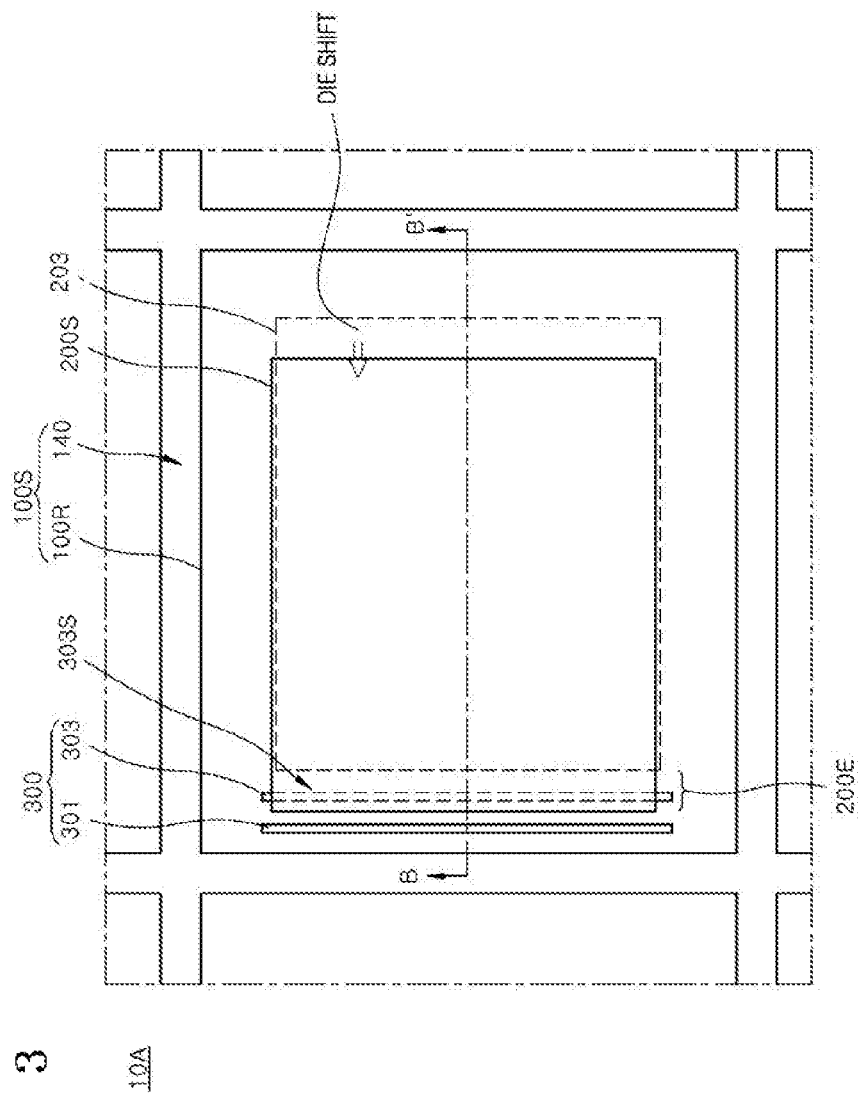
FIG. 3 is a plan view illustrating a method of detecting a die over-shift phenomenon occurring in a semiconductor package according to an embodiment.
Figure 4:
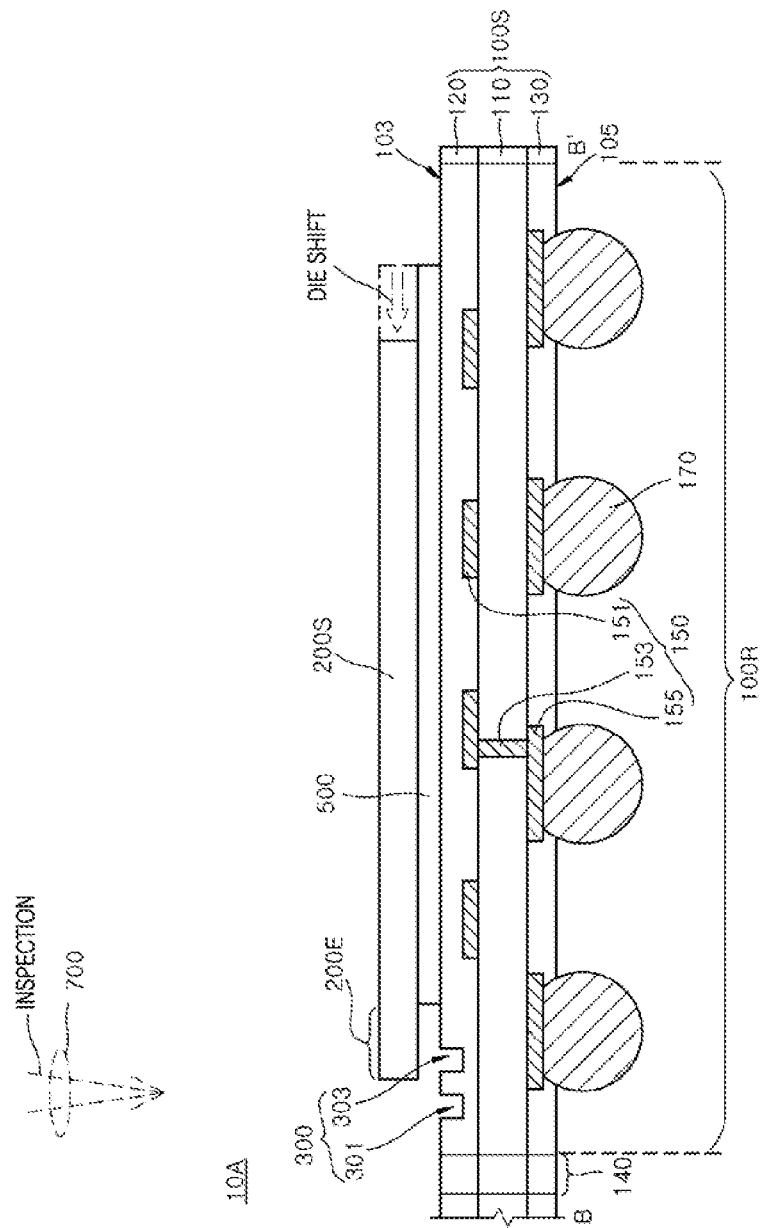
FIG. 4 is a cross-sectional view taken along a line B-B' of FIG. 3.

FIG. 3 is a plan view illustrating a method of detecting a die over-shift phenomenon occurring in a semiconductor package according to an embodiment. FIG. 4 is a cross-sectional view taken along a line B-B' of FIG. 3.

Referring to FIGS. 3 and 4, a semiconductor package 10A may include a semiconductor die 200S which is attached to a strip substrate 100S before an encapsulant (600 of FIG. 2) is formed. The strip substrate 100S may include a plurality of package regions 100R (corresponding to the package substrates 100 of FIG. 1) which are separated from each other by a sawing process. The package regions 100S of the strip substrate 100S may be connected to each other by a sawing region 140. The sawing region 140 may include a scribe lane region. Each of the package regions 100R may include the die attachment region 203 illustrated in FIG. 1.

The semiconductor die 200S may be attached to the package region 100S using a die attachment process. Ideally, the semiconductor die 200S has to be attached to the package region 100R to be perfectly aligned with the die attachment region 203. However, the semiconductor die 200S may be laterally shifted from the die attachment region 203 due to process tolerance of the die attachment process. In such a case, if an amount that the semiconductor die 200S is shifted out of an allowable range, a die over-shift phenomenon may occur.

FIGS. 3 and 4 illustrate an example in which the die over-shift phenomenon occurs. For example, if the die over-shift phenomenon occurs, the semiconductor die 200S may cover at least a portion 303S of the die over-shift indicating pattern 300 when viewed from a plan view. That is, the portion 303S of the die over-shift indicating pattern 300 may be covered with an edge portion 200E of the semiconductor die 200S. The die over-shift indicating pattern 300 may be disposed so that at least a portion (e.g., the portion 303S) of the die over-shift indicating pattern 300 is covered by the semiconductor die 200S when the semiconductor die 200S is shifted over from the die attachment region 203 by a distance which is greater than an allowable range.

As illustrated in FIG. 4, the portion 303S of the die over-shift indicating pattern 300 may be covered by the semiconductor die 200S. Thus, the portion 303S of the die over-shift indicating pattern 300 cannot be seen from a top view due to the presence of the semiconductor die 200S located over the portion 303S of the die over-shift indicating pattern 300. In such a case, a visual inspection may be carried out by inspectors' eyes (i.e., human eyes) or by using an inspection tool 700 such as an optical microscope of relatively low magnifying power. Because the die over-shift indicating pattern 300 is formed having a size large enough so that a shape of the die over-shift indicating pattern 300 may be recognized using only an optical microscope of relatively low magnifying power, inspection tools of relatively high magnifying power may not be needed to observe the die over-shift indicating pattern 300. For example, if the die over-shift indicating pattern 300 is formed to have a width and a thickness (or a depth) of at least several tens of micrometers as well as a length of at least several hundred micrometers, it may be possible to recognize the die over-shift indicating pattern 300 without using inspection tools having a relatively high magnifying power.

If the portion 303S of the die over-shift indicating pattern 300 is not visible due to the semiconductor die 200S when viewed from a top view, the semiconductor die 200S may be regarded as being over-shifted. In such a case, the die attachment process may be regarded as being performed abnormally, and no further processes may be performed.

Figure 8:
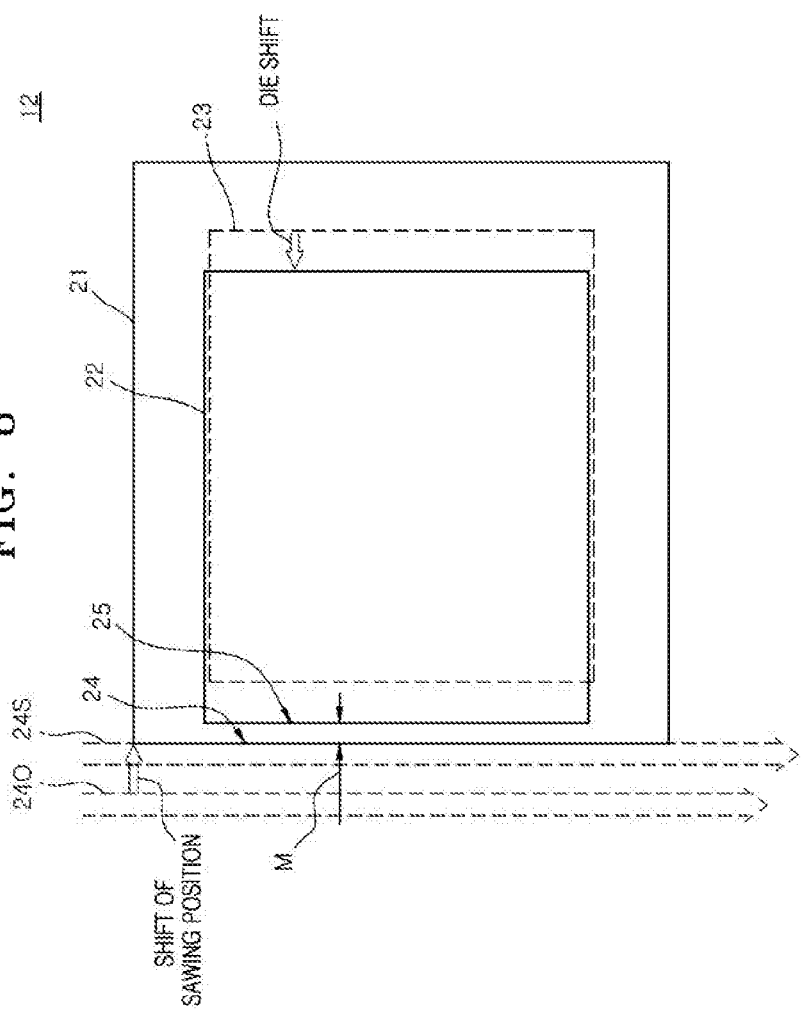
FIG. 8 is a plan view illustrating a die over-shift phenomenon occurring in a semiconductor package according to an embodiment.

If a sawing process is subsequently performed in spite of occurrence of the die over-shift phenomenon, a side margin M of a protection layer (corresponding to the encapsulant 600 of FIG. 2) may be reduced as illustrated in FIG. 8. A semiconductor package 12 illustrated in FIG. 8 corresponds to a comparative example. Referring to FIG. 8, if a semiconductor die 22 is laterally shifted from a die attachment region 23 of a package substrate 21 toward a side surface 24 of the semiconductor package 12, a side surface 25 of the semiconductor die 22 may become closer to the side surface 24 of the semiconductor package 12 to reduce the side margin M corresponding to a distance between the semiconductor die 22 and the side surface 24 of the semiconductor package 12.

If the side margin M is reduced, a width of a sidewall portion of the protection layer covering the semiconductor die 22 may also be reduced to cause a failure in which the semiconductor die 22 embedded in the semiconductor package 12 is seen through the sidewall portion of the protection layer. In such a case, moisture may easily infiltrate into the semiconductor package 12 through an interface between the protection layer and the package substrate 21 to degrade reliability of the semiconductor package 12 or to cause a malfunction of the semiconductor die 22. In addition, if the moisture infiltrates the semiconductor package 12, the semiconductor die 22 may be lifted or delaminated from the package substrate 21. Moreover, if the moisture infiltrates the semiconductor package 12, an adhesive strength between the protection layer and the package substrate 21 may be reduced to cause a delamination phenomenon of the protection layer.

Furthermore, the sawing process may be performed with a sawing blade aligned with a shifted sawing position 24S which is shifted from a predetermined sawing region 240 due to a process tolerance of the sawing process. In such a case, the side surface 24 of the semiconductor package 12 may become closer to the semiconductor die 22 to cause a lack of the side margin M.

As semiconductor packages employed in electronic systems become smaller, a position margin of semiconductor dies disposed in the semiconductor packages has been reduced. According to the embodiments of the present disclosure, semiconductor packages in which the die over-shift phenomenon occurs may be easily inspected to sort out semiconductor packages having a poor side margin of the protection layer. As a result, it may prevent a process yield and reliability of the semiconductor packages from being degraded due to die attachment failure. Whether the die over-shift phenomenon occurs may be verified by inspecting the die over-shift indicating pattern (300 of FIG. 4) before the protection layer is formed. In addition, the degree that the semiconductor die 22 is shifted may also be confirmed by inspecting the die over-shift indicating pattern (300 of FIG. 4) before the protection layer is formed.

Referring again to FIGS. 3 and 4, if the portion 303S of the die over-shift indicating pattern 300 is not seen due to the semiconductor die 200S when viewed from a top view, a portion of the strip substrate 100S on which the semiconductor package 10A including the semiconductor die 200S is fabricated may be selectively sorted in a subsequent process. As such, because the die attachment failure is inspected in an intermediate process step, it may prevent semiconductor packages having a poor side margin from being delivered to customers after the sawing process. If the die over-shift indicating pattern 300 is normally observed when viewed from a top view, a subsequent molding process may be performed to form the protection layer covering the semiconductor die and the strip substrate 100S may be cut using the sawing process to provide a plurality of semiconductor packages which are separated from each other.

Referring again to FIG. 3, if the die over-shift indicating pattern 300 includes a plurality of patterns, for example, the first and second die over-shift indicating patterns 301 and 303 which are parallel with each other, it may be possible to inspect the degree that the semiconductor die 200S is shifted. For example, if only the portion 303S of the first die over-shift indicating pattern 301 is not seen due to the shifted semiconductor die 200S when viewed from a top view, the degree that the semiconductor die 200S is shifted is evaluated as being relatively low. In contrast, if both the first and second die shift indicating that patterns 301 and 303 are not seen due to the shifted semiconductor die 200S when viewed from a top view, the degree of shift of the semiconductor die 200S is evaluated as being relatively high.

More specifically, as described with reference to FIG. 1, if the second, third, and fourth distances D2, D3, and D4 are equal to each other and both the first and second die over-shift indicating patterns 301 and 303 are observed when viewed from a top view, a shifted distance or a degree of shift of the semiconductor die 200S (or 200) may be evaluated as being less than the fourth distance D4. If the second, third, and fourth distances D2, D3, and D4 are equal to each other and only the first die over-shift indicating pattern 301 is observed when viewed from a top view, a shifted distance or a degree of shift of the semiconductor die 200S (or 200) may be evaluated as being greater than the fourth distance D4 and less than twice the fourth distance D4. If the second, third, and fourth distances D2, D3, and D4 are equal to each other and none of the first and second die over-shift indicating patterns 301 and 303 are observed when viewed from a top view, a shifted distance or a degree of shift of the semiconductor die 200S (or 200) may be evaluated as being equal to or greater than at least twice the fourth distance D4. Thus, at least one of the die over-shift indicating patterns 301 and 303 may be used as a reference pattern for obtaining the shifted distance of the semiconductor die 200S (or 200).

As described above, after the semiconductor die 200S (or 200) is attached, the inspection or observation of the die over-shift indicating pattern 300 may be helpful to determine the occurrence of the die over-shift phenomenon.

Figure 5:
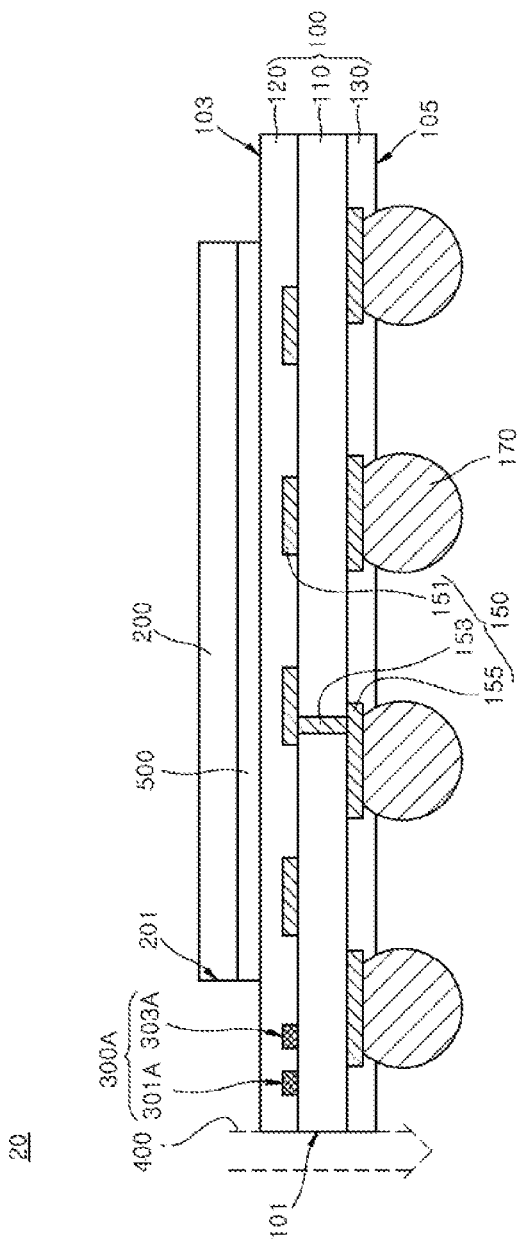
FIG. 5 is a cross-sectional view illustrating a die over-shift indicating pattern of a semiconductor package according to another embodiment.

FIG. 5 is a cross-sectional view illustrating a die over-shift indicating pattern 300A adopted in a semiconductor package 20 according to another embodiment.

Referring to FIG. 5, the die over-shift indicating pattern 300A included in the semiconductor package 20 may be located at substantially the same position as the die over-shift indicating pattern 300 illustrated in FIG. 2, when viewed from a plan view. The die over-shift indicating pattern 300A may include a first die over-shift indicating pattern 301A and a second die over-shift indicating pattern 303A which are parallel with each other. The die over-shift indicating pattern 300A may be disposed between the first dielectric layer 120 and the body layer 110 constituting the package substrate 100. That is, the die over-shift indicating pattern 300A may be covered by the first dielectric layer 120, for example, a solder resist layer. Even though the die over-shift indicating pattern 300A is covered by the first dielectric layer 120, the die over-shift indicating pattern 300A can be visually seen through the first dielectric layer 120 because the first dielectric layer 120 is formed of a solder resist layer which is a semitransparent material.

The die over-shift indicating pattern 300A may be located at the same level as the first interconnection patterns 151 in the package substrate 100 where the first interconnection patterns 151 are disposed between the first dielectric layer 120 and the body layer 110. The die over-shift indicating pattern 300A may be formed to include a conductive layer such as a copper layer. For example, the die over-shift indicating pattern 300A may be formed of substantially the same conductive layer as the first interconnection patterns 151. While the first interconnection patterns 151 are formed, the die over-shift indicating pattern 300A may also be formed. That is, the first interconnection patterns 151 and the die over-shift indicating pattern 300A may be simultaneously formed by patterning a conductive layer.

In FIG. 5, the same reference numerals as used in FIG. 2 denote the same elements.

Figure 6:
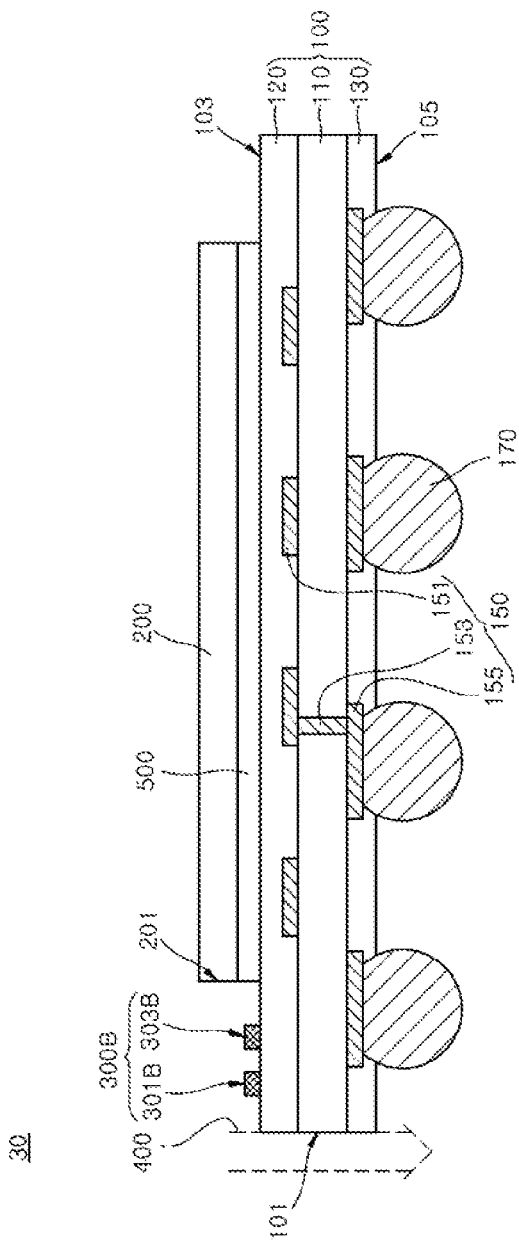
FIG. 6 is a cross-sectional view illustrating a die over-shift indicating pattern of a semiconductor package according to yet another embodiment.

FIG. 6 is a cross-sectional view illustrating a die over-shift indicating pattern 300B of a semiconductor package 30 according to yet another embodiment.

Referring to FIG. 6, the die over-shift indicating pattern 300B of the semiconductor package 30 may be located at substantially the same position as the die over-shift indicating pattern 300 illustrated in FIG. 2, when viewed from a plan view. The die over-shift indicating pattern 300B may include a first die over-shift indicating pattern 301B and a second die over-shift indicating pattern 30313 which are parallel with each other. The die over-shift indicating pattern 300B may be formed to protrude from the first surface 103 corresponding to a surface of the first dielectric layer 120. Thus, the die over-shift indicating pattern 300B may be formed to protrude from the package substrate 100. The die over-shift indicating pattern 300B may be a pattern which is printed on a surface of the first dielectric layer 120 with ink.

In FIG. 6, the same reference numerals as used in FIG. 2 denote the same elements.

Figure 7:
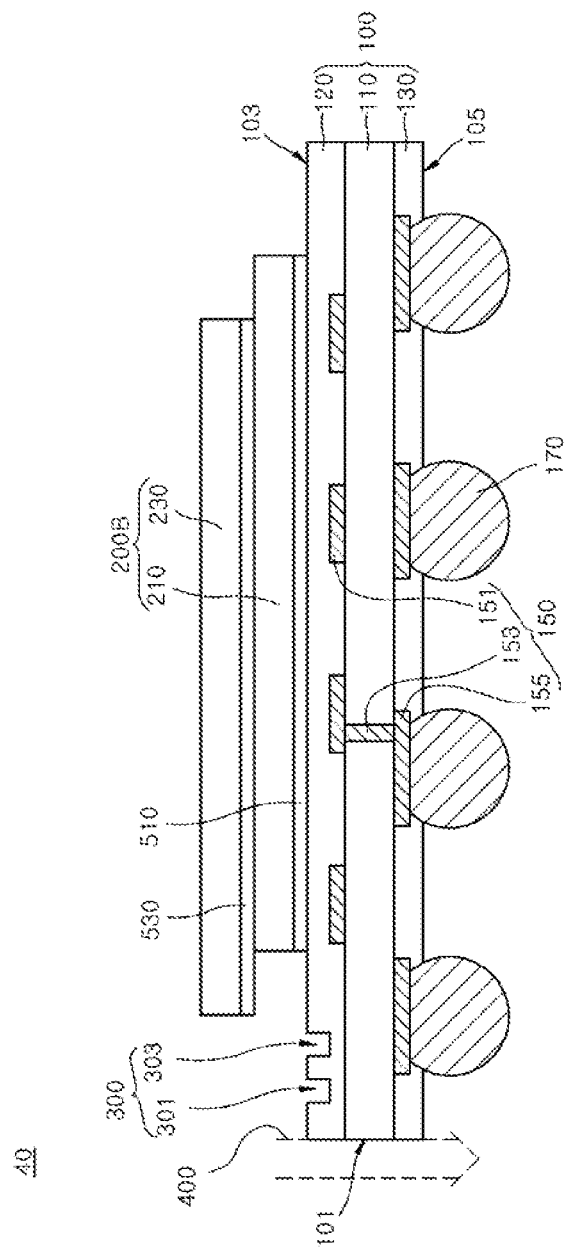
FIG. 7 is a cross-sectional view illustrating a semiconductor package according to still another embodiment.

FIG. 7 is a cross-sectional view illustrating a semiconductor package 40 according to still another embodiment. In FIG. 7, the same reference numerals as used in FIG. 2 denote the same elements.

Referring to FIG. 7, the die over-shift indicating pattern 300 may be applied to the semiconductor package 40 including a semiconductor die stack 200B. The semiconductor die stack 200B may be realized by attaching a first semiconductor die 210 to the die attachment region 23 (see FIG. 8) of the package substrate 100 using a first adhesive layer 510 and by attaching a second semiconductor die 230 to the first semiconductor die 210 using a second adhesive layer 530. Because the semiconductor die stack 200B is realized by stacking at least two semiconductor dies, that is, the first and second semiconductor dies 210 and 230, a probability that the die over-shift phenomenon occurs in the semiconductor package 40 may become higher.

As illustrated in FIG. 7, the first and second semiconductor dies 210 and 230 may be sequentially stacked to be offset by design. In such a case, an edge portion of the second semiconductor die 230 may laterally protrude from a side surface of the first semiconductor die 210 to provide a reverse stepwise structure. Because the second semiconductor die 230 is laterally shifted from the first semiconductor die 210, a possibility that the die over-shift phenomenon occurs in the semiconductor package 40 may become higher.

The die over-shift indicating pattern 300 of the semiconductor package 40 may be used as a means for effectively inspecting the die over-shift phenomenon which is capable of occurring while the semiconductor die stack 200B is formed. In such a case, the die over-shift indicating pattern 300 may be disposed at a position appropriate for inspection of the second semiconductor die 230 which may be shifted. For example, the die over-shift indicating pattern 300 may be disposed such that at least a portion of the die over-shift indicating pattern 300 is covered by the second semiconductor die 230 when the second semiconductor die 230 is laterally shifted from the die attachment region 23 by a distance which is greater than an allowable range.

According to the above embodiments, there are provided semiconductor packages including a die over-shift indicating pattern. The die over-shift indicating pattern may be used to evaluate whether a semiconductor die attached to a package substrate is shifted. Thus, the semiconductor package including the semiconductor die which is shifted may be sorted in advance before a protection layer is formed. As a result, it may be possible to selectively provide only normal semiconductor packages having a side margin which is greater than an allowable range.

Figure 9:
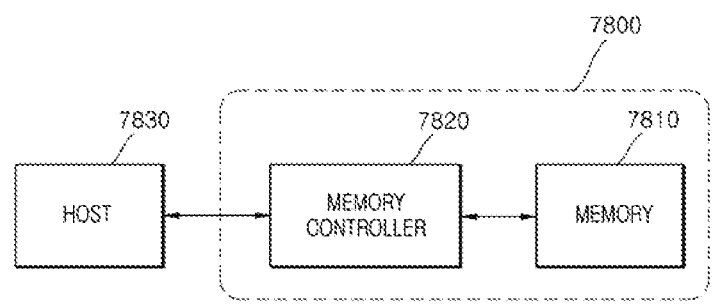
FIG. 9 is a block diagram illustrating an electronic system employing a memory card including a semiconductor package according to an embodiment.

FIG. 9 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
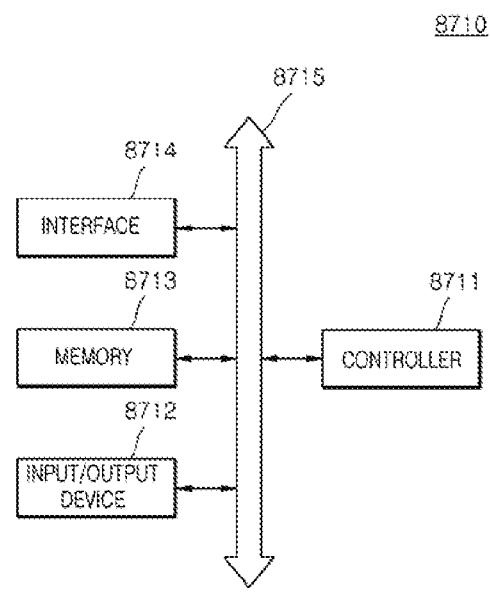
FIG. 10 is a block diagram illustrating another electronic system including a semiconductor package according to an embodiment.

FIG. 10 is a block diagram illustrating an electronic system 8710 including at least one of the packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data moves.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communications, the electronic system 8710 may be used in a communication system using a technique such as CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor package comprising:
    a package substrate including a die attachment region;
    a first semiconductor die attached to the die attachment region;
    a second semiconductor die stacked on the first semiconductor die and offset from the first semiconductor die; and
    a die over-shift indicating pattern disposed in the package substrate and spaced apart from the die attachment region,
    wherein the die over-shift indicating pattern is used as a reference pattern for obtaining a shifted distance of the second semiconductor die,
    wherein the die over-shift indicating pattern is configured to detect whether the shifted distance of the second semiconductor die is greater than an allowable range, and
    wherein the die over-shift indicating pattern is disposed such that at least a portion of the die over-shift indicating pattern is covered by the second semiconductor die when the shifted distance is greater than the allowable range.

2. The semiconductor package of claim 1, wherein the die over-shift indicating pattern includes a line-shaped pattern which is parallel with a line at the side of the die attachment region.

3. The semiconductor package of claim 1, wherein the die over-shift indicating pattern includes two line-shaped patterns which are spaced apart from each other and are parallel with each other.

4. The semiconductor package of claim 1, wherein the die over-shift indicating pattern is a groove-shaped pattern that is engraved at a surface of the package substrate.

5. The semiconductor package of claim 1, wherein the die over-shift indicating pattern protrudes from a surface of the package substrate.

6. The semiconductor package of claim 1, wherein the die over-shift indicating pattern is located at substantially the same level as interconnection patterns formed in the package substrate.

* * * * *